(12) United States Patent
Zhou et al.

(10) Patent No.: US 10,615,182 B2
(45) Date of Patent: Apr. 7, 2020

(54) THIN FILM TRANSISTOR DEVICE AND A METHOD FOR PREPARING THE SAME, ARRAY SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Jideng Zhou, Beijing (CN); Ran Zhang, Beijing (CN); Yi Wang, Beijing (CN); Huanyu Li, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 0 days.

(21) Appl. No.: 16/179,626

(22) Filed: Nov. 2, 2018

(65) Prior Publication Data
US 2019/0305002 A1    Oct. 3, 2019

(30) Foreign Application Priority Data

Mar. 30, 2018    (CN) .......................... 2018 1 0276392

(51) Int. Cl.
*H01L 27/12*    (2006.01)

(52) U.S. Cl.
CPC .......... *H01L 27/124* (2013.01); *H01L 27/127* (2013.01); *H01L 27/1262* (2013.01); *H01L 27/1288* (2013.01); *H01L 27/1225* (2013.01)

(58) Field of Classification Search
CPC ................................................ H01L 29/41733
See application file for complete search history.

(56) References Cited

U.S. PATENT DOCUMENTS

| | | | | |
|---|---|---|---|---|
| 5,675,160 A | * | 10/1997 | Oikawa | ................. H01L 27/108 257/296 |
| 2004/0070713 A1 | * | 4/2004 | Song | ................. G02F 1/133707 349/129 |
| 2017/0117303 A1 | * | 4/2017 | Lee | ...................... H01L 27/1233 |
| 2018/0308871 A1 | * | 10/2018 | Wu | ......................... G11C 19/28 |

* cited by examiner

*Primary Examiner* — Thao P Le
(74) *Attorney, Agent, or Firm* — Kinney & Lange, P.A.

(57) ABSTRACT

A thin film transistor device and a method for preparing the same, an array substrate and a display device are disclosed. The thin film transistor device includes a first thin film transistor and a second thin film transistor coupled with each other. A first electrode of the first thin film transistor, a second electrode of the second thin film transistor, and a connecting line therebetween which is configured to couple the first electrode and the second electrode, are formed in a same layer, with each end of the connecting line being connected between respective ends of the first electrode and the second electrode opposite to each other. In the thin film transistor device, the first electrode and the second electrode are spaced apart from each other by a concave portion which is recessed in a region therebetween.

18 Claims, 6 Drawing Sheets

US 10,615,182 B2

THIN FILM TRANSISTOR DEVICE AND A METHOD FOR PREPARING THE SAME, ARRAY SUBSTRATE AND DISPLAY DEVICE

CROSS-REFERENCE TO RELATED APPLICATION

The present application claims the benefit of Chinese Patent Application No. 201810276392.2 filed on Mar. 30, 2018 in the State Intellectual Property Office of China, the whole disclosure of which is incorporated herein by reference.

BACKGROUND

Technical Field

Embodiments of the present disclosure relate to the technical field of display technologies, and especially to a thin film transistor device and a method for preparing the same, an array substrate and a display device.

Description of the Related Art

In the technical field of flat panel displays, thin film transistor liquid crystal display (abbreviated as TFT-LCD) devices have technical advantages of relatively small volume, relatively low power consumption, relatively low manufacturing cost and the like, such that they have become predominant in the present flat panel display market. A main structure of a TFT-LCD comprises an array substrate and a color film substrate aligned and assembled with each other. In the array substrate, thin film transistors are used as switches to control switching of corresponding pixel units between or among different conditions thereof. By way of example, when a thin film transistor operates in a turn-on condition, data signals may be transferred therethrough to a corresponding pixel unit.

SUMMARY

According to an aspect of the exemplary embodiments of the present disclosure, there is provided a thin film transistor device, comprising: a first thin film transistor and a second thin film transistor coupled with each other; a first electrode of the first thin film transistor, a second electrode of the second thin film transistor, and a connecting line therebetween which couples the first electrode and the second electrode, are formed in a same layer, with each end of the connecting line being connected between respective ends of the first electrode and the second electrode opposite to each other; and in the thin film transistor device, the first electrode and the second electrode are spaced apart from each other by a concave portion which is recessed in a region therebetween.

According to an embodiment of the disclosure, the first electrode and the second electrode are arranged side by side; and an area of the concave portion is smaller than or equal to an area of the region between the first electrode and the second electrode.

According to an embodiment of the disclosure, the first electrode and the second electrode are provided in parallel to each other in a direction along which the thin film transistor device extends; and the connecting line comprises two sub-connecting portions located at both ends of the thin film transistor device in the direction along which the thin film transistor device extends, respectively, each of which extending in a direction perpendicular to the direction along which the thin film transistor device extends, and being connected merely at each end thereof between respective ends of the first electrode and the second electrode opposite to each other.

According to an embodiment of the disclosure, the first electrode and the second electrode are arranged to be in mirror symmetry about a longitudinal axis in a direction along which the thin film transistor device extends.

According to an embodiment of the disclosure, the first electrode and the second electrode are arranged in parallel; and the first electrode comprises a plurality of first sub-electrodes connected in series, and the second electrode comprises a plurality of second sub-electrodes connected in series, the plurality of first sub-electrodes and the plurality of second sub-electrodes extending in a direction perpendicular to the longitudinal axis, respectively.

According to an embodiment of the disclosure, the connecting line extends in the direction perpendicular to the longitudinal direction; and the connecting line connects at one end thereof with two of the plurality of first sub-electrodes at both ends in the first electrode, respectively, and connects at the other end thereof with two of the plurality of second sub-electrodes at both ends in the second electrode, respectively, with the concave portion being further defined in a region surrounded and delimited by the connecting line, the first electrode and the second electrode.

According to an embodiment of the disclosure, two first sub-electrodes of the plurality of first sub-electrodes connected in series in the first thin film transistor, both of which are located respectively outermost on left and right sides, are dummy electrodes; and two second sub-electrodes of the plurality of second sub-electrodes connected in series in the second thin film transistor, both of which are located respectively outermost on left and right sides, are dummy electrodes.

According to an embodiment of the disclosure, each of the plurality of first sub-electrodes and the plurality of second sub-electrodes is in a form of U shape; and arms of the plurality of first sub-electrodes in the form of U shape are interconnected with one another, and arms of the plurality of second sub-electrodes in the form of U shape are also interconnected with one another.

According to an embodiment of the disclosure, the thin film transistor device further comprises: a substrate; a gate on the substrate; a gate insulating layer on a side of the gate facing away from the substrate; an active layer on a side of the gate insulating layer facing away from the substrate; and a third electrode of the first thin film transistor and a fourth electrode of the second thin film transistor on a side of the active layer facing away from the substrate; and the first electrode, the second electrode, the third electrode and the fourth electrode are provided in a same layer.

According to an embodiment of the disclosure, the third electrode comprises a plurality of third sub-electrodes connected in series, and the fourth electrode comprises a plurality of fourth sub-electrodes connected in series, the plurality of third sub-electrodes and the plurality of fourth sub-electrodes extending in a direction perpendicular to the longitudinal axis, respectively.

According to an embodiment of the disclosure, each of the plurality of third sub-electrodes and the plurality of fourth sub-electrodes is in a form of T shape; the plurality of first sub-electrodes open towards the plurality of third sub-electrodes, and the plurality of second sub-electrodes open towards the plurality of fourth sub-electrodes; and the plurality of third sub-electrodes in the form of T shape connect at respective base portions with one another, and extend at respective tip portions into openings of corresponding ones of the plurality of first sub-electrodes, without any contact with the corresponding ones of the plurality of first sub-electrodes; and the plurality of fourth sub-electrodes in the form of T shape connect at respective base portions with one another, and extend at respective tip portions into openings of corresponding ones of the plurality of second sub-electrodes, without any contact with the corresponding ones of the plurality of second sub-electrodes.

According to another aspect of the exemplary embodiments of the disclosure, there is provided an array substrate comprising the thin film transistor device as above, the thin film transistor device being provided in a Gate-driver-on-Array region of the array substrate, with gate driving circuits which are configured to drive the TFTs row by row being formed directly in the Gate-driver-on-Array region of the array substrate.

According to another aspect of the exemplary embodiments of the present disclosure, there is provided a display device, comprising a display panel, the display panel containing the array substrate as above.

According to still another aspect of the exemplary embodiment of the present disclosure, there is provided a method for preparing a thin film transistor device, comprising: forming respective gate, gate insulating layer, active layer and data line metallic layer of both a first thin film transistor and a second thin film transistor, sequentially on a substrate; and forming a first electrode of the first thin film transistor, a second electrode of the second thin film transistor, and a connecting line therebetween which couples the first electrode and the second electrode, by patterning the data line metallic layer; each end of the connecting line is connected between respective ends of the first electrode and the second electrode opposite to each other, and in the thin film transistor device, the first electrode and the second electrode are spaced apart from each other by a concave portion which is recessed in a region therebetween.

According to an embodiment of the disclosure, the step of forming a first electrode of the first thin film transistor, a second electrode of the second thin film transistor, and a connecting line therebetween which couples the first electrode and the second electrode, by patterning the data line metallic layer, comprising: forming a photoresist layer on the data line metallic layer; removing a portion of the photoresist layer at a projection location thereof at which light projects from an all-transparent region of a half-tone mask, by exposing and developing the photoresist layer through the half-tone mask; forming the connecting line in the form of the concave portion, by executing a first etching on the data line metallic layer; removing another portion of the photoresist layer at a projection location thereof at which light projects from a translucent region of the half-tone mask, by executing an ashing on the photoresist layer reserved on the data line metallic layer; and forming the first electrode and the second electrode, by executing a second etching on the data line metallic layer.

According to an embodiment of the disclosure, the step of forming the first electrode and the second electrode by executing a second etching on the data line metallic layer comprising: forming a plurality of first sub-electrodes connected in series in the first electrode, and a plurality of second sub-electrodes connected in series in the second electrode, by executing the second etching on the data line metallic layer; the connecting line connects at one end thereof with two of the plurality of first sub-electrodes at both ends in the first electrode, respectively, and connects at the other end thereof with two of the plurality of second sub-electrodes at both ends in the second electrode, respectively, with the concave portion being further defined in a region surrounded and delimited by the connecting line, the first electrode and the second electrode.

According to an embodiment of the disclosure, two first sub-electrodes of the plurality of first sub-electrodes connected in series in the first thin film transistor, both of which are located respectively outermost on left and right sides, are dummy electrodes; and two second sub-electrodes of the plurality of second sub-electrodes connected in series in the second thin film transistor, both of which are located respectively outermost on left and right sides, are dummy electrodes.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION

Figure 1:
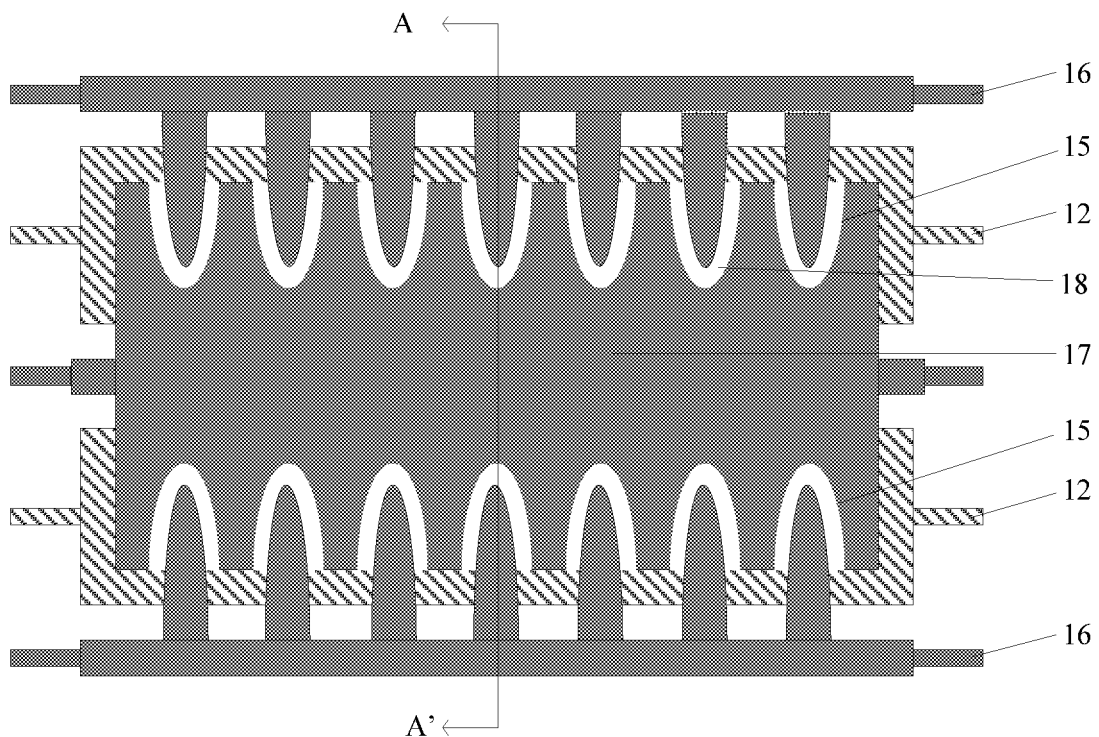
FIG. 1 illustrates a top view of a thin film transistor in the relevant art.

Above technical purposes, features and advantages of the embodiments of the disclosure may be more apparent and more easily perceivable, by describing hereinafter in detail embodiments of the disclosure with reference to the accompanying drawings.

In depictions of the embodiments of the disclosure, unless it is defined definitely otherwise, it should be comprehended that, an expression "a plurality of/the plurality of" means at least two, such as two, three, etc.; and any orientative or positional relationship indicated by terminologies "upper", "lower", "left", "right", "inner", "outer" and so on is based on orientative or positional relationship as illustrated in accompanied drawings, only intending to facilitate and simplify depictions of embodiments of the disclosure, rather than indicating or implying that such referred device or element should necessarily have a specific orientation, or be constructed in a specific orientation or operate in a specific orientation, therefore, such terminologies should not be comprehended as limitations to embodiments of the disclosure.

In embodiments of the disclosure, unless being explicitly specified and defined in the context otherwise, terminologies such as "mount", "connect", "connect(ed) . . . with", and the like are intended to be inclusive and should thus be comprehended in a broad sense, e.g., may be interpreted as fixed connection or detachable connection, or even integrated connection; and may be a mechanical connection, or an electrical connection, or communication with each other or one another; and may be direct connection, or indirection connection via an intermediate medium, or an internal communication between two elements, or even an interaction relationship between two elements. As to those skilled in the art, specific meanings of above terminologies in embodiments of the disclosure may be comprehended according to specific context herein.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings re only intended to exemplarily illustrate the contents of the disclosure, rather than to demonstrate the practical dimension or proportion of components of a thin film transistor device, an array substrate and a display device.

Figure 2:
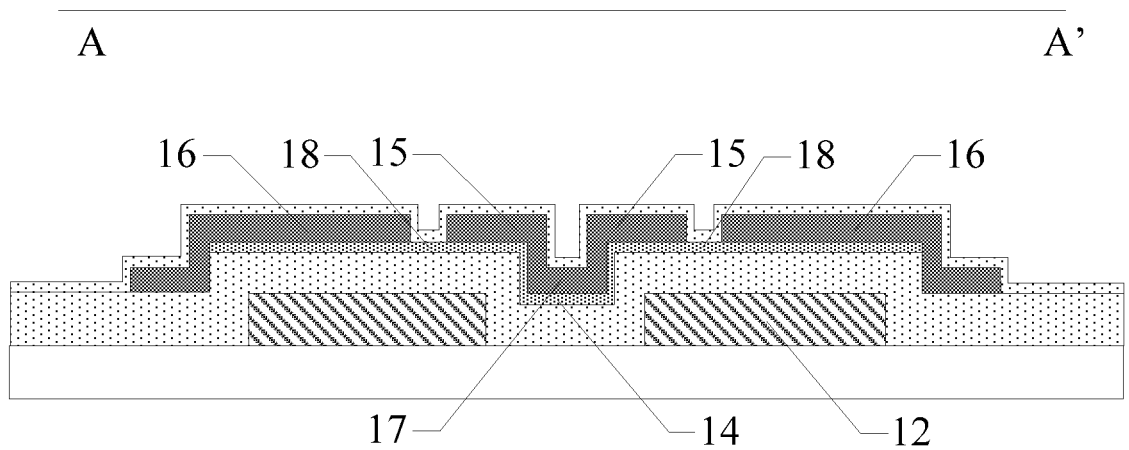
FIG. 2 illustrates a cross-sectional view of the thin film transistor in the relevant art, along a cutting line A-A' as illustrated in FIG. 1.

Referring to FIG. 1, it illustrates a top view of a thin film transistor in a relevant art. Referring to FIG. 2, it illustrates a cross sectional view of a thin film transistor in the relevant art, the cross sectional view being a schematic view of a cross section along a cutting line A-A' in the top view.

As illustrated in FIG. 1 and FIG. 2, in the thin film transistor of the relevant art, sources 15 of TFTs which are coupled with one another are interconnected mutually by a connecting line 17 (e.g., in the form of overlap joint, i.e., a bridging connection), for example, the connecting line 17 being formed in the same layer as the sources 15 and drains 16. Since when channels 18 of TFTs are formed by taking advantage of a halftone mask, it is required to executing an ashing process on a portion of the photoresist located at positions corresponding to (e.g., at least partially overlapping or aligned with) the channels 18; moreover, prior to the ashing being applied on the photoresist, it is required to remove in advance a solvent contained in the photoresist, by a baking process. Therefore, in other words, prior to the ashing being applied on the photoresist, a portion of the photoresist left on the sources 15 should be subjected to a baking process. However, a portion of the photoresist on the connecting line 17 may be heated to expand during the baking process, such that due to the existence of a lateral expansion amount of the photoresist, then the portion of the photoresist located at positions corresponding to the channels 18 may be squeezed inwards the TFTs, a thickness of the portion of the photoresist located at positions corresponding to the channels 18 then increases, and in turn the entire layer of the photoresist is substantially distributed to vary in thickness thereof, i.e., resulting in an uneven and non-uniform thickness distribution; and furthermore, during the ashing applied on the portion of the photoresist located at positions corresponding to the channels 18, once an ashing process of other portions of the photoresist located everywhere else is completed already, then due to the portion of the photoresist having a relatively larger thickness thereof located at positions corresponding to the channels 18 has not been ashed completely yet, photoresist may be left here, resulting in an influence on etching of the metallic material at positions corresponding to the channels 18, and finally resulting in a residue of the metallic material at the channels 18 after etching.

In a relevant art, sources of TFTs coupled with each other or one another are interconnected by metallic material provided thereamong and occupying relatively areas, and photoresist provided above these areas of the metallic material may expand when it is heated upon baking, such that a layer of photoresist within a halftone region may be thickened and thus the photoresist thereat may hardly be removed completely by an ashing process, and a portion of the metallic material of data lines at locations of channels of the TFTs may in turn be hardly etched out clearly; in other words, another portion of the metallic material of data lines may be left after the etching, which fact may result in short-circuiting of the channels.

According to a general technical concept of embodiments of the present disclosure, in an aspect of the embodiments of the disclosure, a thin film transistor and a method for preparing the same are provided.

Figure 3:
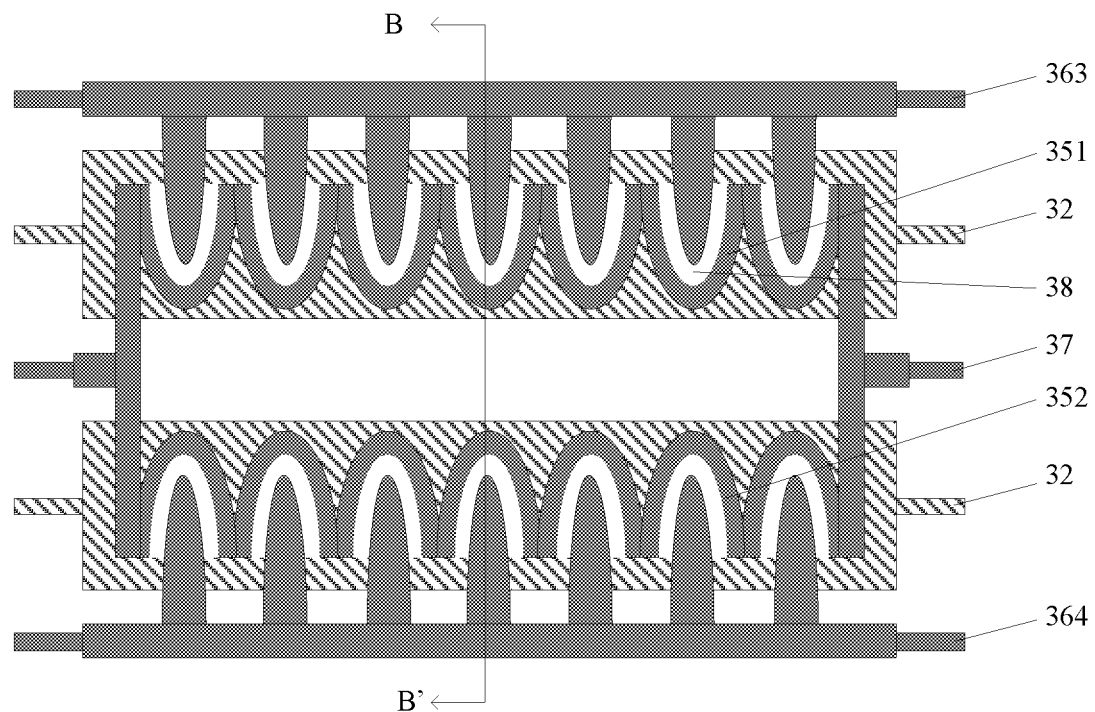
FIG. 3 illustrates a top view of a thin film transistor according to the embodiment of the disclosure.
Figure 4:
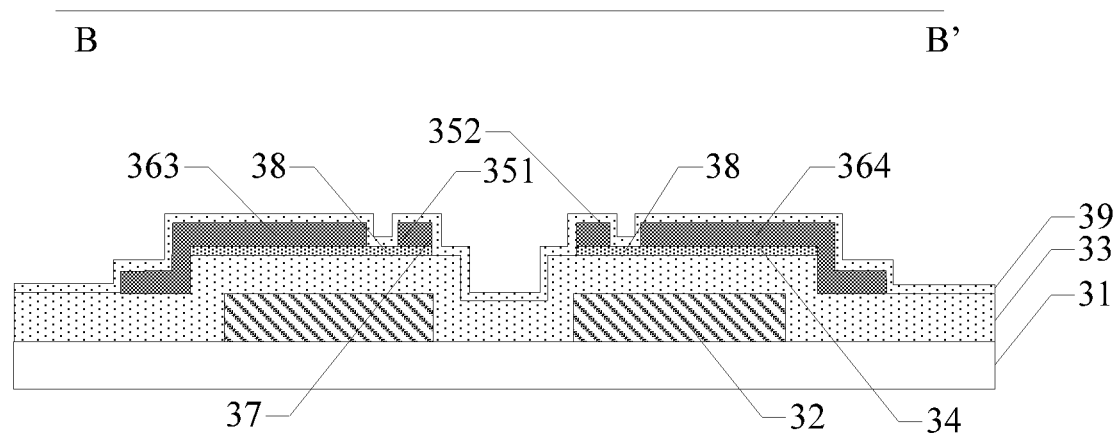
FIG. 4 illustrates a cross sectional view of the thin film transistor according to an embodiment of the disclosure, along a cutting line B-B' as illustrated in FIG. 3.

Referring to FIG. 3, it illustrates a top view of the thin film transistor according to an embodiment of the disclosure. Referring to FIG. 4, it illustrates a cross sectional view of the thin film transistor according to an embodiment of the disclosure, along a cutting line B-B' as illustrated in FIG. 3. The thin film transistor may for example be applied to the technical field of display technology, by way of example, be applied to semiconductor display devices, such as liquid crystal display panel or OLED display panel, and the like.

The thin film transistor according to the embodiment of the disclosure comprises a first thin film transistor and a second thin film transistor coupled with each other. The first thin film transistor comprises a gate 32, a first electrode 351, and a third electrode 363, the first electrode 351 and the third electrode 363 for example at least partially overlapping with the gate 32 as illustrated; and the second thin film transistor comprises another gate 32, a second electrode 352 and a fourth electrode 364, the second electrode 352 and the fourth electrode 364 for example at least partially overlapping with the another gate 32. The first electrode 351 of the first thin film transistor, the second electrode 352 of the second thin film transistor, and a connecting line 37 therebetween which couples the first electrode 351 and the second electrode 352, are formed in a same layer, with each end of the connecting line 37 being connected between respective ends of the first electrode 351 and the second electrode 352 opposite to each other; and in the thin film transistor device, the first electrode and 351 the second electrode 352 are spaced apart from each other by a concave portion which is recessed in a region therebetween.

Specifically, for example, the first electrode 351 and the second electrode 352 are arranged side by side and to extend in a same direction (e.g., in a direction perpendicular to the surface of the paper sheet, as illustrated in FIG. 3) and spaced apart from each other, e.g., at a specific distance, which may be predetermined (by way of example, such a distance is measured at respective points of the first electrode and the second electrode located most adjacent to each other, i.e., illustrated to be a spacing between tips of respective projections facing towards each other), and a surface area of the concave portion is smaller than or equal to a surface area of the region between the first electrode 351 and the second electrode 352. As an exemplary alternative embodiment, the surface area of the concave portion may also be set to be equal to the surface area of the region between the first electrode 351 and the second electrode 352, such that the surface area of the connecting line 37 is decreased effectively as compared with the surface area of a connecting line in the relevant art, in turn decreasing significantly an influence applied by a thermal expansion of the portion of photoresist on the connecting line 37 during the baking, on the thickness of the portion of the photoresist located at positions corresponding to channels 38, and then effectively alleviating any adverse influence of the residue of the metallic material at the channels 38. In practical application, as another exemplary alternative embodiment, the surface area of the concave portion may also for example be set to be smaller than the surface area of the region between the first electrode 351 and the second electrode 352, e.g., by providing the concave portion within the region between the first electrode 351 and the second electrode 352, adjacent to but not abutting against respective edges of the first electrode 351 and the second electrode 352, respectively, with the connecting line 37 which has a predetermined width being left between the first electrode 351 and the second electrode 352. Due to the existence of a deformation amount of thermal expansion of the portion of photoresist coated on the connecting line 37 of the predetermined width during the baking process, then it is difficult to influence the thickness of the portion of photoresist located at positions corresponding to the channels 38 across the concave portion, and thus the problem of the residue of the metallic material at the channels 38 may be alleviated effectively.

By way of example, as illustrated in FIG. 3 and FIG. 4, according to an embodiment of the disclosure, the first electrode 351 and the second electrode 352 are provided in parallel to each other in a direction along which the thin film transistor device extends; and the connecting line 37 comprises two sub-connecting portions located respectively at both ends of the thin film transistor device in the direction along which the thin film transistor device extends, each of the two sub-connecting portions extending in a direction perpendicular to the direction along which the thin film transistor device extends, and being connected merely at each end thereof between respective ends of the first electrode 351 and the second electrode 352 opposite to each other.

Specifically, the first electrode 351 and the second electrode 352 are for example arranged to be in mirror symmetry about a longitudinal axis (i.e., an axis thereof in its lengthwise direction) in a left-to-right direction (i.e., a horizontal direction) along which the thin film transistor device extends. The first electrode 351 and the second electrode 352 are arranged side by side and extend in parallel (e.g., in the direction perpendicular to the surface of the paper sheet, as illustrated in FIG. 3); the first electrode 351 comprises a plurality of first sub-electrodes connected in series, for example, connected in series at respective ends abutting against one another in the left-to-right longitudinal direction, as illustrated in FIG. 3; and the second electrode 352 comprises a plurality of second sub-electrodes connected in series, for example, connected in series at respective ends abutting against one another in the left-to-right longitudinal direction, as illustrated in FIG. 3. As also illustrated in FIG. 3, the plurality of first sub-electrodes and the plurality of second sub-electrodes extend in a direction perpendicular to both the longitudinal axis and the surface of the paper sheet; and the connecting line 37 extends in a direction perpendicular to the longitudinal axis and parallel to the surface of the paper sheet.

The connecting line 37 connects at one end thereof with two of the plurality of first sub-electrodes at outermost ends both on the left hand side and on the right hand side in the first electrode 351, and connects at the other end thereof with two of the plurality of second sub-electrodes at outermost ends both on the left hand side and on the right hand side in the second electrode 352, with the concave portion being further defined in a region surrounded and delimited/defined by the connecting line 37, the first electrode 351 and the second electrode 352.

In practical application, the thin film transistor further comprises: a substrate 31; a gate 32 provided on the substrate 31; a gate insulating layer 33 provided on a side of the gate 32 facing away from the substrate 31; an active layer 34 provided on a side of the gate insulating layer 33 facing away from the substrate 31; and a third electrode 363 of the first thin film transistor and a fourth electrode 364 of the second thin film transistor on a side of the active layer 34 facing away from the substrate 31. The first electrode 351, the second electrode 352, the third electrode 363 and the fourth electrode 364 are provided in a same layer. As illustrated, the third electrode 363 comprises a plurality of third sub-electrodes, which for example extend in a direction perpendicular to the longitudinal axis and are connected in series with one another at respective base portions thereof via a common electrode portion for example extending in the direction of the longitudinal axis; and the fourth electrode 364 comprises a plurality of fourth sub-electrodes, which for example extend in the direction perpendicular to the longitudinal axis and are connected in series with one another at respective base portions thereof via another common electrode portion for example extending in the direction of the longitudinal axis.

Figure 5:
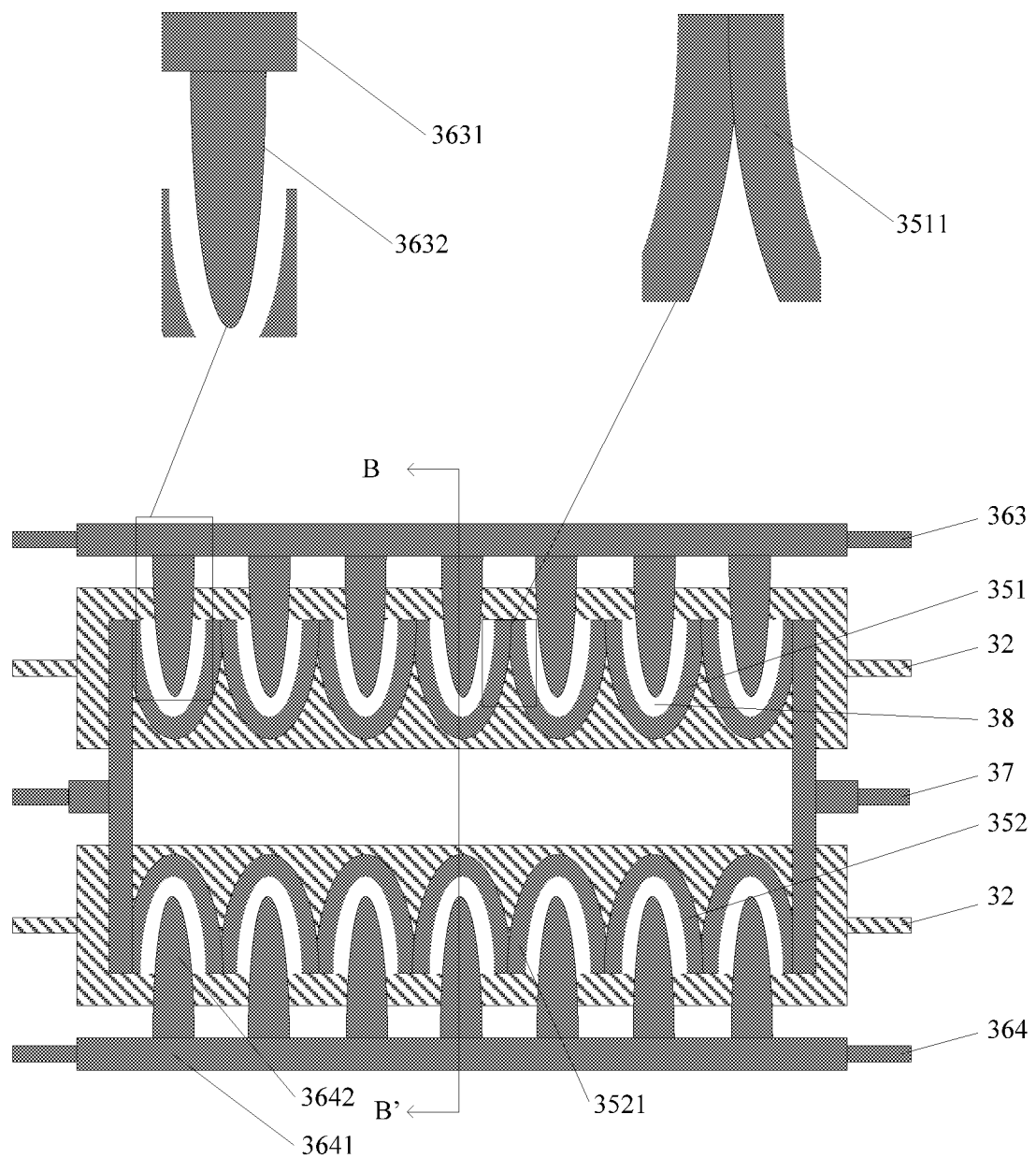
FIG. 5 illustrates another top view of a thin film transistor according to an embodiment of the disclosure, in which an exemplary first sub-electrode in the form of U shape receiving a third sub-electrode in the form of T shape is illustrated in a partial enlarged view, while an interface portion between two adjacent first sub-electrodes each in the form of U shape is illustrated in another partial enlarged view, respectively.

Specifically, as illustrated in FIG. 5, it illustrates another top view of a thin film transistor according to an embodiment of the disclosure, in which an exemplary first sub-electrode in the form of U shape receiving a third sub-electrode in the form of T shape (without any contact therebetween) is illustrated in a partial enlarged view, while an interface portion between two adjacent first sub-electrodes each in the form of U shape is illustrated in another partial enlarged view, respectively. By way of example, as illustrated, each of the plurality of first sub-electrodes and the plurality of second sub-electrodes are formed to be in a form of U shape; arms 3511 of the plurality of first sub-electrodes in the form of U shape are interconnected with one another, and arms 3521 of the plurality of second sub-electrodes in the form of U shape are also interconnected with one another. Each of the plurality of third sub-electrodes and the plurality of fourth sub-electrodes is in a form of T shape. The plurality of first sub-electrodes open towards the plurality of third sub-electrodes, and in turn receive the plurality of third sub-electrodes without any contact therebetween, respectively; and the plurality of second sub-electrodes open towards the plurality of fourth sub-electrodes; and in turn receive the plurality of fourth sub-electrodes without any contact therebetween, respectively. The plurality of third sub-electrodes in the form of T shape connect at respective base portions 3631 with one another, for example via the common electrode portion as illustrated, and extend at respective tip portions 3632 into openings of corresponding ones of the plurality of first sub-electrodes, without any contact with the corresponding ones of the plurality of first sub-electrodes. The plurality of fourth sub-electrodes in the form of T shape connect at respective base portions 3641 with one another, for example via the another common electrode portion as illustrated, and extend at respective tip portions 3642 into openings of corresponding ones of the plurality of second sub-electrodes, without any contact with the corresponding ones of the plurality of second sub-electrodes.

In an exemplary embodiment of the disclosure, the first thin film transistor and/or the second thin film transistor may for example be thin film transistor(s) formed by a Single-Slit-Mask (abbreviated as SSM) process. In other words, in a thin film transistor device of this type, each of the thin film transistors is for example designed to have a single narrow channel. In relevant art, if the channels 38 of TFTs are formed by the SSM process, then, due to a relatively small length of each of the channel 38, there may typically be a short-circuiting of the channel even in case of a tiny amount of residue of the metallic material of data lines at positions corresponding to the channels 38. In the embodiment of the disclosure, by providing the concave portion in the region defined between the first electrode and the second electrode, so as to decrease effectively the surface area of the connecting line 37 there, and in turn to decrease the surface area of the metallic material there. As such, the data line metallic layer at the location of the concave portion may be etched away in the first etching; and therefore, during the baking process applied on the photoresist prior to the ashing process, the area of the photoresist layer covering the locations of the connecting line 37, the first electrode 351 and the second electrode 352 may subsequently be decreased significantly, such that once the portion of photoresist expands when being heated, the influence applied by the thermal expansion of the portion of photoresist on the thickness of the portion of the photoresist located at positions corresponding to channels 38 may also be decreased significantly, in turn effectively alleviating any adverse influence of the residue of the metallic material at the channels 38 of the TFTs.

Specifically, In a process of preparing the thin film transistor device by a Half Tone Mask process, once not only a process of applying a metallic coating film onto the gate insulating layer 33, the active layer 34 and the data line is completed, but also a process of exposure and development of the photoresist (i.e., exposing and developing the photoresist) by a half-tone mask is completed, then, different portions of the photoresist at various locations may for example present/exhibit three development conditions, i.e., a completely developed condition, a partially developed condition, and a undeveloped condition, due to different photosensitive depth thereof. By way of example, in a condition that a positive photoresist is adopted, then, one portion of the photoresist 41 located at a position corresponding to (e.g., aligned with) an all-transparent region of the half-tone mask may be sensitized completely after the exposure process, and then be completely developed; and another portion of the photoresist 41 located at a position corresponding to (e.g., aligned with) a translucent region of the half-tone mask may be partially sensitized, such that only a portion of its thickness of the whole layer of photoresist 41 there may be eliminated/removed due to development, i.e., partially developed, still with certain left portion of its thickness of the whole layer of photoresist 41 remaining unchanged since it fails to be developed; and the other portion of the photoresist 41 located at a position corresponding to (e.g., aligned with) a light-shielding region (i.e., a non-transparent/an opaque region) of the half-tone mask remains un-sensitized, such that this portion of the photoresist 41 of the whole layer remains un-developed. The full-transparent region of the half-tone mask is provided corresponding to the location of the concave portion of the connecting line 37 and the location of a pixel region of the TFT and the like; the translucent region of the half-tone mask is provided typically corresponding to the location of channel 38 of the TFT and the like; and the light-shielding region of the half-tone mask is provided corresponding to the locations of the first electrode 351, the second electrode 352 and the connecting line 37 and the like. In other words, after the exposure and development are carried out with the half-tone mask, the photoresist covering the location of the concave portion of the connecting line 37 is completely developed. Therefore, during the first etching, the metallic material of the connecting line 37 at the location of the concave portion may be etched away, where neither data line metallic material nor photoresist may be reserved after the first etching. As such, prior to the ashing process, there is no photoresist at the location of the concave portion of the connecting line 37, significantly decreasing the area of the layer of the photoresist covering the connecting line 37, and in turn decreasing/alleviating influence on the thickness of the photoresist located at positions corresponding to the channels 38 due to thermal expansion of the photoresist during the baking process. In practical application, typically, the thin film transistor device further comprises a passivation layer 39 configured to protect the thin film transistor device.

In summary, as to the thin film transistor device according to the embodiment of the disclosure, it comprises a first thin film transistor and a second thin film transistor coupled with each other. The first electrode 351 of the first thin film transistor, a second electrode 352 of the second thin film transistor, and a connecting line 37 therebetween which couples the first electrode 351 and the second electrode 352, are formed in a same layer, with each end of the connecting line 37 being connected between respective ends of the first electrode 351 and the second electrode 352 opposite to each other; and in the thin film transistor device, the first electrode 351 and the second electrode 352 are spaced apart from each other by a concave portion which is recessed in a region therebetween, so as to decrease the area of the connecting line. As such, it significantly decreases the influence on the thickness of the photoresist on the connecting line 37 located at positions corresponding to the channels 38 due to thermal expansion of the photoresist during the baking process, and in turn alleviates effectively the problem of the residue of the metallic material at the channels 38, reducing risk of any short-circuiting defect at the channels 38.

Figure 6:
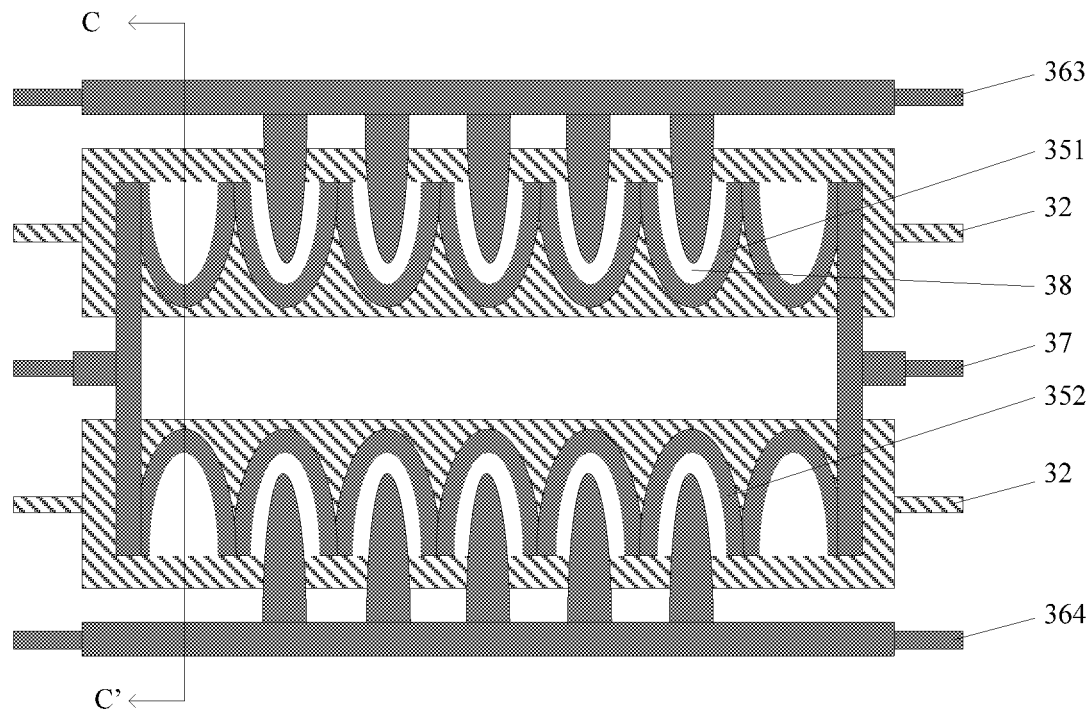
FIG. 6 illustrates a top view of another thin film transistor according to the embodiment of the disclosure.
Figure 7:
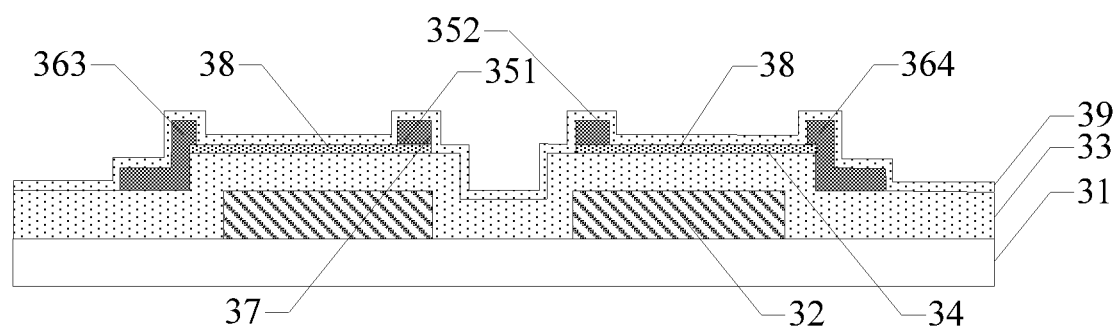
FIG. 7 illustrates a cross sectional view of the another thin film transistor according to an embodiment of the disclosure, along a cutting line C-C' as illustrated in FIG. 6.

As illustrated in FIG. 6, it illustrates a top view of another thin film transistor according to the embodiment of the disclosure. As illustrated in FIG. 7, it illustrates a cross sectional view of the another thin film transistor according to an embodiment of the disclosure, along a cutting line C-C' as illustrated in FIG. 6.

Based on the above embodiments, by way of example, two first sub-electrodes of the plurality of first sub-electrodes connected in series in the first thin film transistor, both of which are located respectively outermost on left and right sides, are dummy electrodes; and two second sub-electrodes of the plurality of second sub-electrodes connected in series in the second thin film transistor, both of which are located respectively outermost on left and right sides, are dummy electrodes, too. As such, even a partial residue of the metallic material is formed at edge(s) of the thin film transistor device, no short-circuiting may occur at the channels 38.

Specifically, in a condition that the connecting line 37 has a relatively large line width at a portion thereof located to be abutting against or adjacent to respective ends of the first electrode 351 and the second electrode 352 opposite to and most adjacent to each other, i.e., in case that the connecting line 37 has a relatively large area thereof at the portion thereof located to be abutting against or adjacent to respective ends of the first electrode 351 and the second electrode 352 opposite to and most adjacent to each other, then, during the baking process of the photoresist prior to the ashing process, the photoresist on the connecting line 37 thereat may be heated to expand during the baking process, resulting in an increase in the thickness of the photoresist at positions corresponding to the channels of TFTs adjacent to the connecting line. Furthermore, during the ashing process of the photoresist at positions corresponding to the channels 38, a photoresist residue is formed, influencing the etching of metallic material at positions corresponding to the channels 38, and finally resulting in a residue of the metallic material at the channels 38 left after etching, and in turn a short-circuiting defect of the channels 38, such that a normal operation of TFTs located adjacent to the connecting line may be influenced adversely. In order to avoid a short-circuiting defect of TFTs there, by way of example, two first sub-electrodes of the plurality of first sub-electrodes connected in series in the first thin film transistor, both of which are located respectively outermost on left and right sides, are set to be dummy electrodes; and two second sub-electrodes of the plurality of second sub-electrodes connected in series in the second thin film transistor, both of which are located respectively outermost on left and right sides, are also are set to be dummy electrodes. As illustrated in FIG. 6, in openings of the dummy electrodes in the form of U shape, neither a third electrode 363 in the form of T shape, nor a fourth electrode 364 in the form of T shape is provided therein.

Therefore, it may further avoid a channel short-circuiting, which may result from an influence applied by the photoresist on the connecting line 37 on each of the thin film transistors having a single narrow channel during the process for forming the thin film transistors.

In summary, as to the thin film transistor device according to an embodiment of the disclosure, for example, two first sub-electrodes of the plurality of first sub-electrodes connected in series in the first thin film transistor, both of which are located respectively outermost on left and right sides, are for example dummy electrodes; and two second sub-electrodes of the plurality of second sub-electrodes connected in series in the second thin film transistor, both of which are located respectively outermost on left and right sides, are also for example dummy electrodes. As such, t may further avoid a channel short-circuiting, which may result from an influence applied by the photoresist on the connecting line 37 on each of the thin film transistors having a single narrow channel during the process for forming the thin film transistors.

Based on above embodiments of the disclosure, in another aspect of the disclosure, an array substrate is provided, comprising the thin film transistor device as above. By way of example, the thin film transistor device is provided in a Gate-Driver-on-Array (abbreviated as GOA) region of the array substrate. The GOA region is a region in which gate driver ICs configured to drive the TFTs row by row are manufactured directly on the array substrate, instead of external gate driver ICs which are arranged outside the array substrate and configured to drive gates as in relevant art.

In addition, in still another aspect of the disclosure, a display device is further provided, comprising a display panel, and optionally, a housing configured to accommodate the display panel, the display panel comprising the array substrate as above. Specifically, the display device may for example be any one product or component having a display functionality, such as a liquid crystal panel, an OLED display panel, an electronic paper device, an organic lighting display panel, a mobilephone, a tablet computer, a television set, a display, a laptop computer, a digital frame, a navigator and the like.

Figure 8:
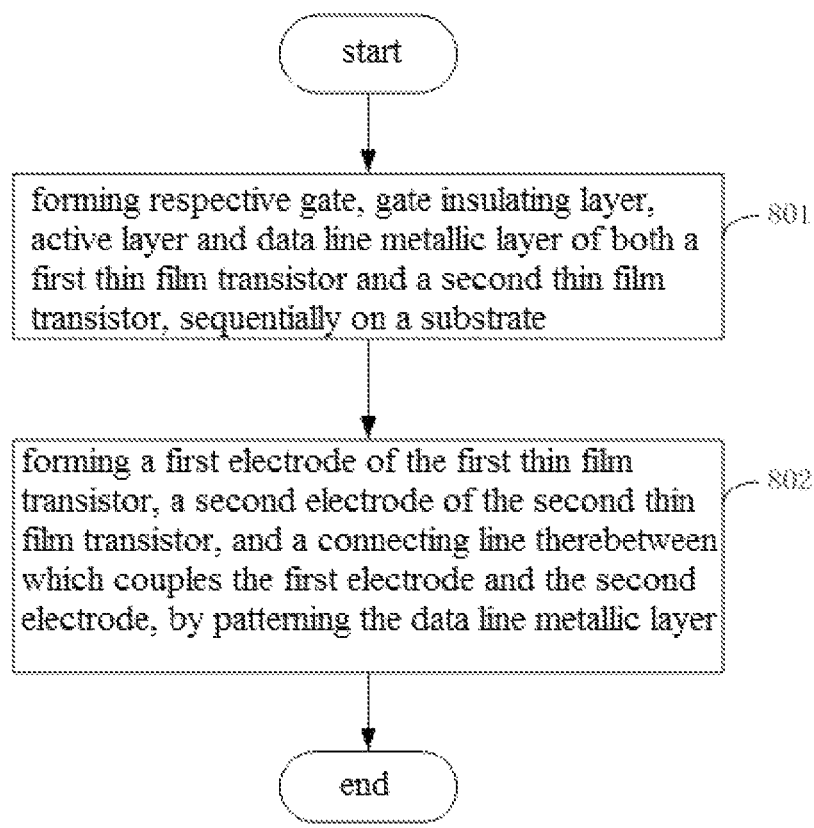
FIG. 8 illustrates a flow chart of a method for preparing a thin film transistor according to an embodiment of the disclosure.

In yet another aspect of the disclosure, a method for preparing a thin film transistor is provided, which is adapted to preparation of the aforementioned thin film transistor device. As illustrated in FIG. 8, it illustrates a flow chart of a method for preparing a thin film transistor according to an embodiment of the disclosure.

Step 801: forming respective gate, gate insulating layer, active layer and data line metallic layer of both a first thin film transistor and a second thin film transistor, sequentially on a substrate.

Figure 9:
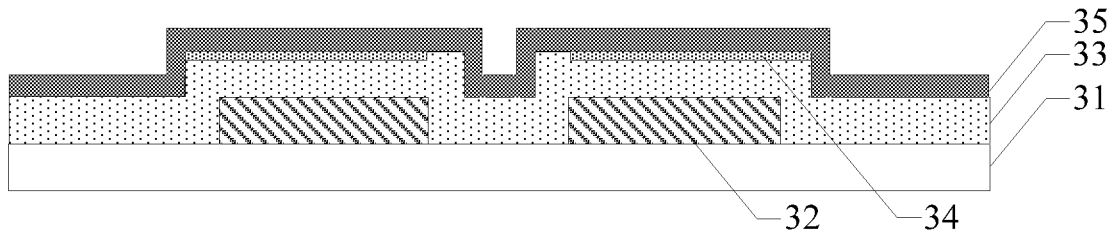
FIG. 9 illustrates a schematic structural view of a condition in a first step of work processes in the method for preparing an oxide thin film transistor, according to an embodiment of the disclosure.

Specifically, as illustrated in FIG. 9, by way of example, a metallic thin film is formed on the substrate 31, and is then subjected to a patterning process so as to form gates 32. And an insulation film is also formed on the substrate 31, covering on the gates 32, and functions as the gate insulating layer 33; in other words, the gate insulating layer 33 is provided on a side of the gates facing away from the substrate 31. In addition, a metal-oxide semiconductor film is formed on a side of the gate insulating layer 33 facing away from the substrate 31, and in turn processed by a patterning process into an active layer 34. And a data line metallic layer 35 is formed on a side of the active layer 34 facing away from the substrate 31. And the patterning process comprises steps such as lithography, etching, and peeling-off and the like.

Step 802: forming a first electrode of the first thin film transistor 351, a second electrode of the second thin film transistor 352, and a connecting line 37 therebetween which couples the first electrode and the second electrode, by patterning the data line metallic layer.

Figure 10:
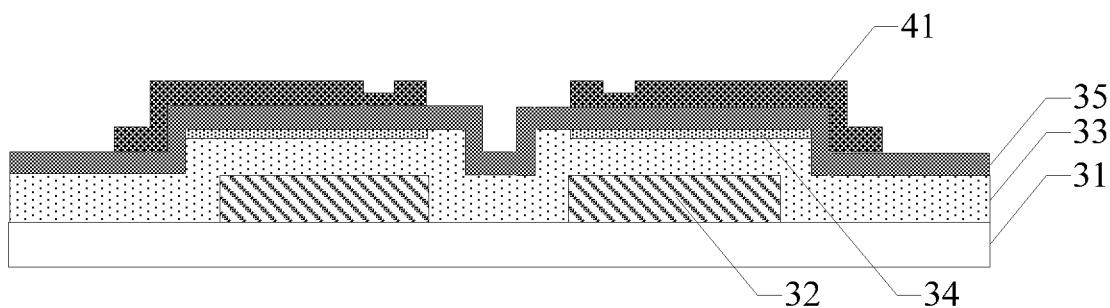
FIG. 10 illustrates a schematic structural view of a condition in a second step of work processes in the method for preparing an oxide thin film transistor, according to an embodiment of the disclosure.
Figure 11:
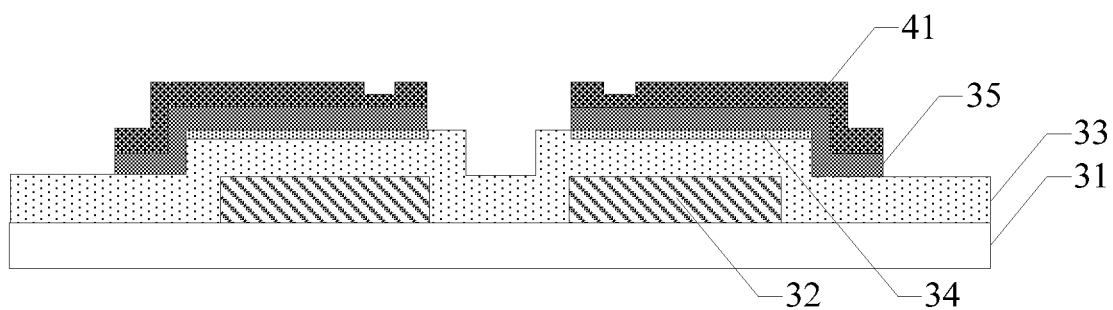
FIG. 11 illustrates a schematic structural view of a condition in a third step of work processes in the method for preparing an oxide thin film transistor, according to an embodiment of the disclosure.
Figure 12:
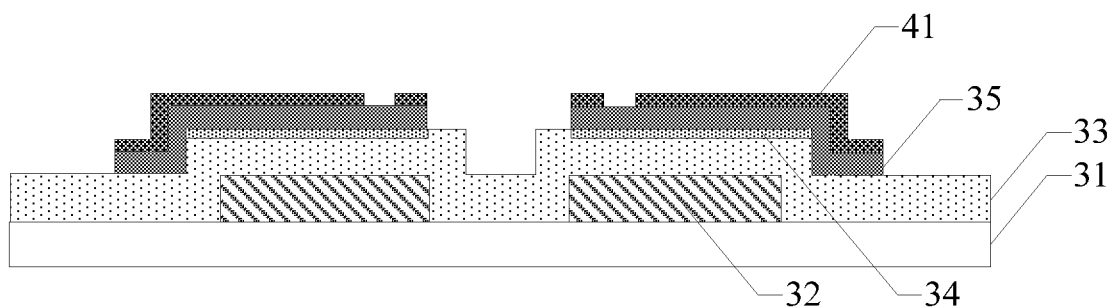
FIG. 12 illustrates a schematic structural view of a condition in a fourth step of work processes in the method for preparing an oxide thin film transistor, according to an embodiment of the disclosure.
Figure 13:
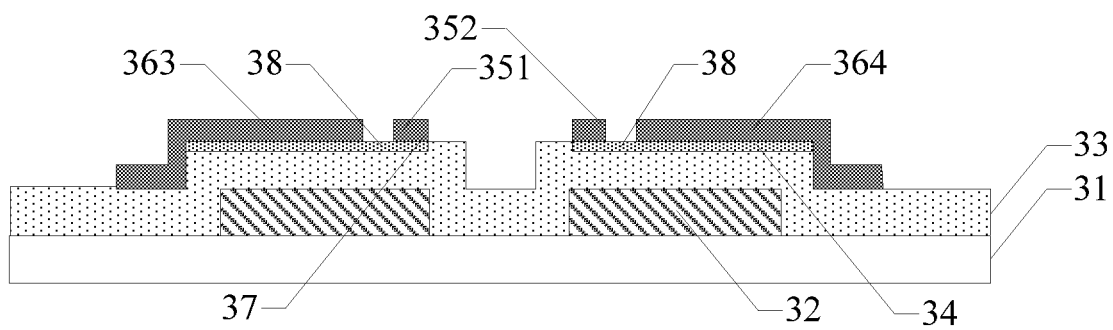
FIG. 13 illustrates a schematic structural view of a condition in a fifth step of work processes in the method for preparing an oxide thin film transistor, according to an embodiment of the disclosure.

Specifically, as illustrated in FIG. 10, once the data line metallic layer 35 is formed, e.g., a photoresist layer 41 is formed on a side of the data line metallic layer 35 facing away from the substrate 31, the photoresist layer 41 is exposed and developed with a half-tone mask so as to remove a portion of the layer of the photoresist 41 at a projection location of the half-tone mask at which light projects from an all-transparent region of the half-tone mask. In practical application, different portions of the photoresist 41 at various locations may for example present/exhibit three development conditions, i.e., a completely developed condition, a partially developed condition, and a undeveloped condition, due to different photosensitive depth thereof. By way of example, in a condition that a positive photoresist is used as the photoresist 41, then, one portion of the photoresist 41 located at a position corresponding to (e.g., aligned with) an all-transparent region of the half-tone mask may be sensitized completely after the exposure process, and then be completely developed; and another portion of the photoresist 41 located at a position corresponding to (e.g., aligned with) a translucent region of the half-tone mask may be partially sensitized, such that only a portion of its thickness of the whole photoresist layer 41 there may be eliminated/removed due to development, i.e., partially developed, still with certain left portion of its thickness of the whole photoresist layer 41 remaining unchanged since it fails to be developed; and the other portion of the photoresist 41 located at a position corresponding to (e.g., aligned with) a light-shielding region (i.e., a non-transparent/an opaque region) of the half-tone mask remains un-sensitized, such that this portion of the photoresist 41 of the whole layer remains un-developed. The full-transparent region of the half-tone mask is provided corresponding to the location of the concave portion of the connecting line 37 and the location of a pixel region of the TFT and the like; the translucent region of the half-tone mask is provided typically corresponding to the location of channel 38 of the TFT and the like; and the light-shielding region of the half-tone mask is provided corresponding to the locations of the first electrode 351, the second electrode 352 and the connecting line 37 and the like. In other words, after the exposure and development are carried out with the half-tone mask, the photoresist 41 covering the location of the concave portion of the connecting line 37 is completely developed. Each end of the connecting line 37 is connected between respective ends of the first electrode 351 and the second electrode 352 opposite to each other; and in the thin film transistor device, the first electrode 351 and the second electrode 352 are spaced apart from each other by a concave portion which is recessed in a region therebetween As illustrated in FIG. 11, after the exposure and development of the photoresist layer 41 with the half-tone mask, e.g., a first etching is carried out on the data line metallic layer 35 so as to form the concave portion in the region between the first electrode 351 and the second electrode 352, i.e., at a junction of the first electrode 351 and the second electrode 352. And as illustrated in FIG. 12, another portion of the photoresist layer 41 at a projection location thereof at which light projects from a translucent region of the half-tone mask is removed, by applying an ashing step on the photoresist layer 41 reserved on the data line metallic layer 35. Then, as illustrated in FIG. 13, channels 38 of the first thin film transistor and the second thin film transistor are formed, by applying a second etching on the data line metallic layer 35. Since the concave portion at the junction of the first electrode 351 and the second electrode 352 has already been formed prior to the ashing step on the photoresist layer 41 reserved on the data line metallic layer 35, then, in the baking process before the ashing, there is no photoresist 41 at the location of the concave portion, significantly decreasing the area of the photoresist layer 41 covering the connecting line 37, and in turn decreasing/alleviating influence on the thickness of the photoresist 41 located at positions corresponding to the channels 38 due to thermal expansion of the photoresist 41 during the baking process. In practical application, after two etching of the data line metallic layer 35, typically, a passivation layer 39 is formed on the data line metallic layer 35, so as to have a protective effect thereon.

In practical application, two first sub-electrodes of the plurality of first sub-electrodes connected in series in the first thin film transistor, both of which are located respectively outermost on left and right sides, are for example dummy electrodes; and two second sub-electrodes of the plurality of second sub-electrodes connected in series in the second thin film transistor, both of which are located respectively outermost on left and right sides, are for example dummy electrodes, too. As such, even a partial residue of the metallic material is formed at edge(s) of the thin film transistor device, no short-circuiting may occur at the channels 38.

In summary, as to the method for preparing a thin film transistor device according to the embodiment of the disclosure, by way of example, respective gate 32, gate insulating layer 33, active layer 34 and data line metallic layer 35 of both a first thin film transistor and a second thin film transistor, are formed sequentially on a substrate 31; and then, a first electrode 351 of the first thin film transistor, a second electrode 352 of the second thin film transistor, and a connecting line 37 therebetween which couples the first electrode 351 and the second electrode 352, are formed, by patterning the data line metallic layer 35. And each end of the connecting line 37 is connected between respective ends of the first electrode 351 and the second electrode 352 opposite to each other, and in the thin film transistor device, the first electrode 351 and the second electrode 352 are spaced apart from each other by a concave portion which is recessed in a region therebetween, so as to decrease the area of the connecting line. As such, it significantly decreases the influence on the thickness of the photoresist 41 located at positions corresponding to the channels 38 due to thermal expansion of the photoresist 41 on the connecting line 37 during the baking process, and in turn alleviates effectively the problem of the residue of the metallic material at the channels, reducing risk of any short-circuiting defect at the channels.

There are several advantageous technical effects brought about by the technical solutions as provided in embodiments of the disclosure, as below:

A thin film transistor device and a method for preparing the same, an array substrate and a display device are provided in the embodiments of the disclosure, the thin film transistor device including a first thin film transistor and a second thin film transistor coupled with each other; a first electrode of the first thin film transistor, a second electrode of the second thin film transistor, and a connecting line therebetween which is configured to couple the first electrode and the second electrode, are formed in a same layer, with each end of the connecting line being connected between respective ends of the first electrode and the second electrode opposite to each other; and in the thin film transistor device, the first electrode and the second electrode are spaced apart from each other by a concave portion which is recessed in a region therebetween, so as to decrease the area of the connecting line. As such, it significantly decreases the influence on the thickness of the photoresist located at positions corresponding to the channels due to thermal expansion of the photoresist on the connecting line during the baking process, and in turn alleviates effectively the problem of the residue of the metallic material at the channels, reducing risk of any short-circuiting defect at the channels.

Various embodiments of the present disclosure have been illustrated progressively, the same or similar parts of which can be referred to each other or one another. The differences among these various embodiments are described in emphasis.

The transfer template, the display substrate, the display panel and the method for manufacturing the same are illustrated in detail as above in embodiments of the disclosure, by using specific exemplary embodiments to set forth principles and implementations thereof, only intending to assist in understanding the methods and core concept thereof in embodiments of the disclosure.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A thin film transistor device, comprising:
    a first thin film transistor and a second thin film transistor coupled with each other,
    wherein a first electrode of the first thin film transistor, a second electrode of the second thin film transistor, and a connecting line which couples the first electrode and the second electrode, are formed in a same layer, each end of the connecting line being connected at respective ends of the first electrode and the second electrode opposite to each other; and
    wherein in the thin film transistor device, the first electrode and the second electrode are spaced apart from each other by a concave portion which is recessed in a region between the first electrode and the second electrode.

2. The thin film transistor device according to claim 1, wherein:
    the first electrode and the second electrode are arranged side by side; and
    an area of the concave portion is smaller than or equal to an area of the region between the first electrode and the second electrode.

3. The thin film transistor device according to claim 1, wherein:
    the first electrode and the second electrode are provided in parallel to each other in a direction along which the thin film transistor device extends; and
    the connecting line comprises two sub-connecting portions located at both ends of the thin film transistor device in the direction along which the thin film transistor device extends, respectively, each of the two sub-connecting portions extending in a direction perpendicular to the direction along which thin film transistor device extends, and each of the two sub-connecting portions also being connected merely at each end thereof between respective ends of the first electrode and the second electrode opposite to each other.

4. The thin film transistor device according to claim 1, wherein:
    the first electrode and the second electrode are arranged to be in mirror symmetry about a longitudinal axis in a direction along which the thin film transistor device extends.

5. The thin film transistor device according to claim 4, wherein:
    the first electrode and the second electrode are arranged in parallel; and
    the first electrode comprises a plurality of first sub-electrodes connected in series, and the second electrode comprises a plurality of second sub-electrodes connected in series, the plurality of first sub-electrodes and the plurality of second sub-electrodes extending in a direction perpendicular to the longitudinal axis, respectively.

6. The thin film transistor device according to claim 5, wherein:
    the connecting line extends in the direction perpendicular to the longitudinal axis; and
    the connecting line connects at a first end thereof with two of the plurality of first sub-electrodes at both ends in the first electrode, respectively, and connects at the a second end thereof with two of the plurality of second sub-electrodes at both ends in the second electrode, respectively, with the concave portion being further defined in a region surrounded and delimited by the connecting line, the first electrode and the second electrode.

7. The thin film transistor device according to claim 5, wherein:
    two first sub-electrodes of the plurality of first sub-electrodes connected in series in the first thin film transistor, which are located respectively outermost on left and right sides, are dummy electrodes; and
    two second sub-electrodes of the plurality of second sub-electrodes connected in series in the second thin film transistor, which are located respectively outermost on left and right sides, are dummy electrodes.

8. The thin film transistor device according to claim 6, wherein:
two first sub-electrodes of the plurality of first sub-electrodes connected in series in the first thin film transistor, which are located respectively outermost on left and right sides, are dummy electrodes; and
two second sub-electrodes of the plurality of second sub-electrodes connected in series in the second thin film transistor, which are located respectively outermost on left and right sides, are dummy electrodes.

9. The thin film transistor device according to claim 1, wherein:
each of the plurality of first sub-electrodes and the plurality of second sub-electrodes is in a form of U shape; and
arms of the plurality of first sub-electrodes in the form of U shape are interconnected with one another, and arms of the plurality of second sub-electrodes in the form of U shape are also interconnected with one another.

10. The thin film transistor device according to claim 1, further comprising:
a substrate;
a gate on the substrate;
a gate insulating layer on a side of the gate facing away from the substrate;
an active layer on a side of the gate insulating layer facing away from the substrate; and
a third electrode of the first thin film transistor and a fourth electrode of the second thin film transistor on a side of the active layer facing away from the substrate;
wherein the first electrode, the second electrode, the third electrode and the fourth electrode are provided in the same layer.

11. The thin film transistor device according to claim 9, wherein:
the third electrode comprises a plurality of third sub-electrodes connected in series, and the fourth electrode comprises a plurality of fourth sub-electrodes connected in series, the plurality of third sub-electrodes and the plurality of fourth sub-electrodes extending in a direction perpendicular to the longitudinal axis, respectively.

12. The thin film transistor device according to claim 11, wherein:
each of the plurality of third sub-electrodes and the plurality of fourth sub-electrodes is in a form of T shape;
the plurality of first sub-electrodes open towards the plurality of third sub-electrodes, and the plurality of second sub-electrodes open towards the plurality of fourth sub-electrodes; and
the plurality of third sub-electrodes in the form of T shape connect at respective base portions with one another, and extend at respective tip portions into openings of corresponding ones of the plurality of first sub-electrodes, without any contact with the corresponding ones of the plurality of first sub-electrodes; and
the plurality of fourth sub-electrodes in the form of T shape connect at respective base portions with one another, and extend at respective tip portions into openings of corresponding ones of the plurality of second sub-electrodes, without any contact with the corresponding ones of the plurality of second sub-electrodes.

13. An array substrate comprising the thin film transistor device according to claim 1, the thin film transistor device being provided in a Gate-driver-on-Array region of the array substrate, with gate driving circuits which are configured to drive the TFTs row by row being formed directly in the Gate-driver-on-Array region of the array substrate.

14. A display device, comprising a display panel, the display panel containing the array substrate according to claim 13.

15. A method for preparing a thin film transistor device, comprising:
forming a respective gate, gate insulating layer, active layer and data line metallic layer of both a first thin film transistor and a second thin film transistor, sequentially on a substrate; and
forming a first electrode of the first thin film transistor, a second electrode of the second thin film transistor, and a connecting line therebetween which couples the first electrode and the second electrode, by patterning the data line metallic layer,
wherein each end of the connecting line is connected between respective ends of the first electrode and the second electrode opposite to each other, and in the thin film transistor device, the first electrode and the second electrode are spaced apart from each other by a concave portion which is recessed in a region therebetween.

16. The method according to claim 15, wherein the step of forming a first electrode of the first thin film transistor, a second electrode of the second thin film transistor, and a connecting line therebetween which couples the first electrode and the second electrode, by patterning the data line metallic layer, comprises:
forming a photoresist layer on the data line metallic layer;
removing a first portion of the photoresist layer at a projection location thereof at which light projects from an all-transparent region of a half-tone mask, by exposing and developing the photoresist layer through the half-tone mask;
forming the connecting line in the form of the concave portion, by executing a first etching on the data line metallic layer;
removing a second portion of the photoresist layer at a projection location thereof at which light projects from a translucent region of the half-tone mask, by executing an ashing on the photoresist layer reserved on the data line metallic layer; and
forming the first electrode and the second electrode, by executing a second etching on the data line metallic layer.

17. The method according to claim 16, wherein the step of forming the first electrode and the second electrode by executing a second etching on the data line metallic layer comprising:
forming a plurality of first sub-electrodes connected in series in the first electrode, and a plurality of second sub-electrodes connected in series in the second electrode, by executing the second etching on the data line metallic layer,
wherein the connecting line connects at one end thereof with two of the plurality of first sub-electrodes at both ends in the first electrode, respectively, and connects at the other end thereof with two of the plurality of second sub-electrodes at both ends in the second electrode, respectively, with the concave portion being further defined in a region surrounded and delimited by the connecting line, the first electrode and the second electrode.

18. The method according to claim 15, wherein:
two first sub-electrodes of the plurality of first sub-electrodes connected in series in the first thin film transistor, which are located respectively outermost on left and right sides, are dummy electrodes; and two second sub-electrodes of the plurality of second sub-electrodes connected in series in the second thin film transistor, which are located respectively outermost on left and right sides, are dummy electrodes.

* * * * *